United States Patent
Zang et al.

(10) Patent No.: US 10,211,315 B2
(45) Date of Patent: Feb. 19, 2019

(54) VERTICAL FIELD-EFFECT TRANSISTOR HAVING A DIELECTRIC SPACER BETWEEN A GATE ELECTRODE EDGE AND A SELF-ALIGNED SOURCE/DRAIN CONTACT

(71) Applicant: GLOBALFOUNDRIES Inc., Grand Cayman (KY)

(72) Inventors: Hui Zang, Guilderland, NY (US); Haigou Huang, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/654,165

(22) Filed: Jul. 19, 2017

(65) Prior Publication Data

US 2019/0027586 A1     Jan. 24, 2019

(51) Int. Cl.
*H01L 29/66*     (2006.01)
*H01L 29/78*     (2006.01)
*H01L 29/417*     (2006.01)

(52) U.S. Cl.
CPC .... *H01L 29/66666* (2013.01); *H01L 29/6656* (2013.01); *H01L 29/66787* (2013.01); *H01L 29/7827* (2013.01)

(58) Field of Classification Search
CPC ........... H01L 29/66666; H01L 29/6656; H01L 29/66787; H01L 29/7827–29/7828; H01L 29/42392; H01L 29/41741; H01L 29/66712–29/66734; H01L 29/7802–29/7815; H01L 19/78648; H01L 21/823487; H01L 27/2454; H01L 51/057; H01L 29/78642; H01L 29/0676; H01L 21/823885; H01L 29/823871; H01L 21/76897; H01L 21/823468; H01L 21/76834
USPC ........................................................ 257/239
See application file for complete search history.

(56) References Cited

U.S. PATENT DOCUMENTS

| 9,041,095 | B2 * | 5/2015 | Masuoka | H01L 29/7827 257/329 |
|---|---|---|---|---|
| 9,287,362 | B1 * | 3/2016 | Basu | H01L 29/152 |
| 9,490,362 | B2 * | 11/2016 | Masuoka | H01L 21/823885 |
| 9,853,028 | B1 * | 12/2017 | Cheng | H01L 27/0886 |
| 2015/0318214 | A1 * | 11/2015 | Tsai | H01L 21/823487 257/9 |
| 2016/0049397 | A1 * | 2/2016 | Chang | H01L 27/092 257/329 |
| 2016/0181362 | A1 * | 6/2016 | Yang | H01L 29/0649 257/329 |

(Continued)

*Primary Examiner* — Marc Armand
*Assistant Examiner* — Younes Boulghassoul
(74) *Attorney, Agent, or Firm* — Thompson Hine LLP; Anthony Canale

(57) ABSTRACT

Structures for a vertical-transport field-effect transistor and methods for forming a structure for a vertical-transport field-effect transistor. A semiconductor fin is formed on a source/drain region. A gate stack is deposited that coats the semiconductor fin and a contact landing area of the source/drain region adjacent to the semiconductor fin. The gate stack is patterned to remove the gate stack from the contact landing area and to form a gate electrode having a section adjacent to the contact landing area. The section of the gate electrode is laterally recessed to form a cavity, and a dielectric spacer is formed in the cavity.

7 Claims, 6 Drawing Sheets

(56) References Cited

U.S. PATENT DOCUMENTS

2017/0358497 A1* 12/2017 Cheng ............ H01L 21/823418

* cited by examiner

VERTICAL FIELD-EFFECT TRANSISTOR HAVING A DIELECTRIC SPACER BETWEEN A GATE ELECTRODE EDGE AND A SELF-ALIGNED SOURCE/DRAIN CONTACT

BACKGROUND

The present invention relates to semiconductor device fabrication and integrated circuits and, more specifically, to structures for a vertical-transport field-effect transistor and methods for forming a structure for a vertical-transport field-effect transistor.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation.

Planar field-effect transistors and fin-type field-effect transistors constitute a category of transistor structures in which the flow of gated current in the channel is oriented in a horizontal direction parallel to the substrate surface. In a vertical-transport field-effect transistor, the source/drain regions are arranged at the top and bottom of a semiconductor fin or pillar. The direction of the gated current in the channel between the source region and the drain region is oriented generally perpendicular (i.e., vertical) to the substrate surface and parallel to the height of the semiconductor fin or pillar.

The bottom source/drain region of a vertical-transport field-effect transistor is contacted by a contact that extends vertically from above the top source/drain region. The gate electrode must remain isolated from the contact. As the distance between the gate electrode and the contact is downwardly scaled, the ability to reliably maintain the electrical isolation becomes more difficult due to, for example, shifts in the lithography overlay forming the contact opening for the contact. The result of compromised electrical isolation may be an electrical short between the gate electrode and the contact to the bottom source/drain region.

SUMMARY

In an embodiment, a method of forming a structure for a vertical-transport field effect transistor is provided. The method includes forming a semiconductor fin on a source/drain region, and depositing a gate stack that coats the semiconductor fin and a contact landing area of the source/drain region adjacent to the semiconductor fin. The gate stack is patterned to remove the gate stack from the contact landing area and to form a gate electrode having a section adjacent to the contact landing area. The section of the gate electrode is laterally recessed to form a cavity, and a dielectric spacer is formed in the cavity.

In an embodiment, a structure for a vertical-transport field effect transistor is provided. The structure includes a source/drain region including a contact landing area, a semiconductor fin on the source/drain region, and a gate electrode coupled with the semiconductor fin. The gate electrode includes a section adjacent to the contact landing area. The structure further includes a contact having a contacting relationship with the contact landing area, and a dielectric spacer laterally arranged between the section of the gate electrode and the contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
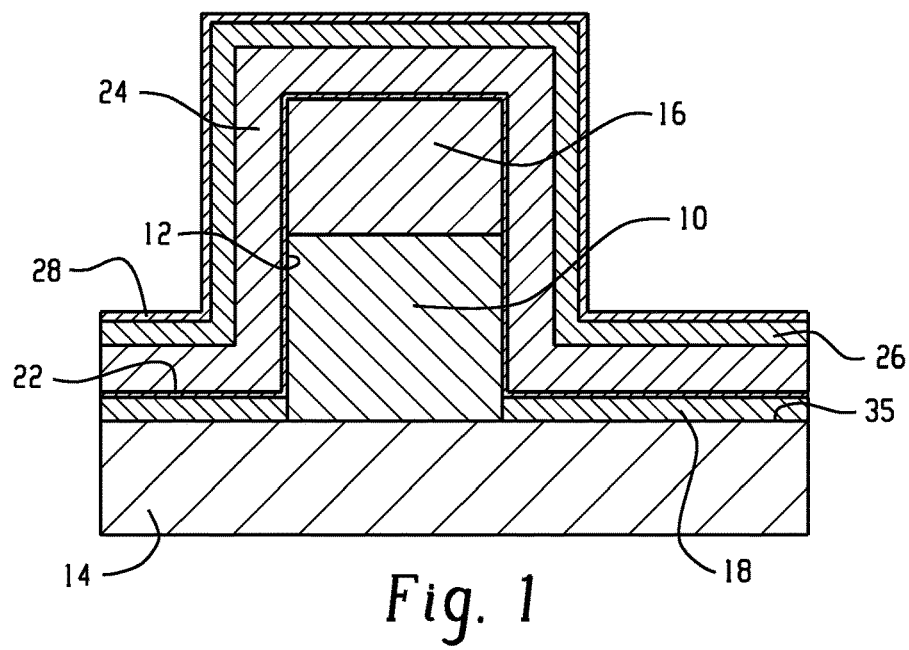
FIGS. 1-11 are cross-sectional views of a device structure at successive fabrication stages of a processing method in accordance with embodiments of the invention.

With reference to FIG. 1 and in accordance with embodiments of the invention, a fin 10 projects in a vertical direction from a bottom source/drain region 14. As used herein, the term "source/drain region" means a doped region of semiconductor material that can function as either a source or a drain of a field-effect transistor. A substrate (not shown) located beneath the bottom source/drain region 14 may be, for example, a bulk single-crystal silicon substrate. The bottom source/drain region 14 may be shared with other fins and may have a shape defined by shallow trench isolation.

The fin 10 is a three-dimensional body composed of a semiconductor material, such as undoped or intrinsic silicon. The fin 10 includes sidewalls 12 that project in a vertical direction relative to the top surface of the bottom source/drain region 14. The fin 10 may be formed from an epitaxial layer of intrinsic semiconductor material that is patterned using photolithography and etching processes, such as a sidewall imaging transfer (SIT) process or self-aligned double patterning (SADP). The fin 10 is capped by a cap 16 that is composed of a dielectric material, such as silicon carbonitride (SiCN), and that may be a remnant of the patterning process.

The bottom source/drain region 14 may be composed of a doped semiconductor material. The fin 10 and the bottom source/drain region 14 may be used to fabricate an n-type vertical-transport field-effect transistor, in which instance the bottom source/drain region 14 may be composed of silicon and may include a concentration of an n-type dopant from Group V of the Periodic Table (e.g., phosphorus (P) and/or arsenic (As)) that imparts n-type electrical conductivity to silicon. Alternatively, the fin 10 and the bottom source/drain region 14 may be used to fabricate a p-type vertical-transport field-effect transistor, in which instance, the bottom source/drain region 14 may be composed of a silicon-germanium (SiGe) alloy and may include a concentration of p-type dopant from Group III of the Periodic Table (e.g., boron (B), aluminum (Al), gallium (Ga), and/or indium (In)) that imparts p-type electrical conductivity to silicon-germanium.

A bottom spacer layer 18 is arranged on the bottom source/drain region 14. The bottom spacer layer 18 may be composed of a low-k dielectric material, such as silicon oxycarbonitride (SiOCN), deposited by atomic layer deposition (ALD). The fin 10 penetrates in the vertical direction through the thickness of the bottom spacer layer 18 with only a fraction of its length (i.e., height) overlapped at its base by the bottom spacer layer 18.

A gate dielectric layer 22 is conformally deposited on the fin 10 and the bottom spacer layer 18 so as to coat the fin 10 and bottom spacer layer 18. The gate dielectric layer 22 may be composed of a dielectric material, such as a high-k dielectric having a dielectric constant (e.g., permittivity) greater than the dielectric constant of silicon dioxide ($SiO_2$). In embodiments, candidate high-k dielectric materials for the gate dielectric layer 22 may have a dielectric constant (i.e., permittivity) greater than 10 and, in an embodiment, may have a dielectric constant in a range of 10 to 100. High-k dielectric materials suitable for the gate dielectric layer 22 include, but are not limited to, a hafnium-based dielectric material like hafnium oxide ($HfO_2$), a layered stack of a hafnium-based dielectric material and another dielectric material (e.g., aluminum oxide ($Al_2O_3$)), or combinations of these and other dielectric materials, deposited by ALD.

A gate stack 24 is formed that overlaps with the fin 10 and that coats the gate dielectric layer 22 on the fin 10 and the bottom spacer layer 18. The gate stack 24 may be composed of one or more barrier metal layers and/or work function metal layers, such as titanium aluminum carbide (TiAlC), titanium nitride (TiN), and/or tungsten (W). The layers of the gate stack 24 may be serially deposited by physical vapor deposition (PVD) or chemical vapor deposition (CVD) on the fin 10 and the bottom spacer layer 18.

A spacer layer 26 is formed that coats the gate stack 24 on the fin 10 and the bottom spacer layer 18. The spacer layer 26 may be composed of a low-k dielectric material, such as silicon oxycarbonitride (SiOCN), conformally deposited by ALD. A dielectric layer 28 is formed that covers the spacer layer 26 on the fin 10 and the bottom spacer layer 18. The dielectric layer 28 may be composed of a dielectric material, such as silicon dioxide ($SiO_2$), conformally deposited by ALD.

Figure 2:
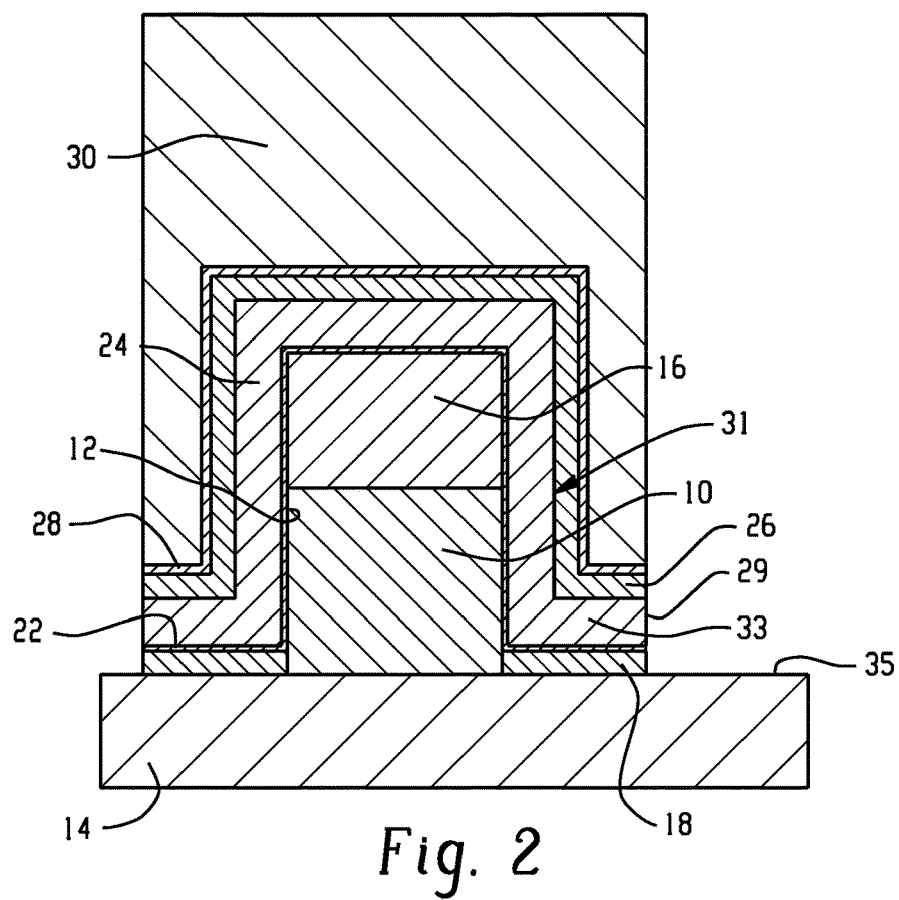

With reference to FIG. 2 in which like reference numerals refer to like features in FIG. 1 and at a subsequent fabrication stage, a sacrificial layer 30 is applied and patterned to form an etch mask for patterning the gate stack 24, as well as the layers 22, 26, and 28. The sacrificial layer 30 may be comprised of a spin-on hardmask, such as an organic planarization layer (OPL), applied by spin coating. The sacrificial layer 30 is patterned by lithography and etching to form the etch mask.

The gate stack 24 and the layers 22, 26, and 28 are patterned by one or more etching processes, which may employ reactive ion etching (ME) and may be conducted in multiple etching steps with different etch chemistries. The patterned gate stack 24 forms a gate electrode, generally indicated by reference numeral 31, that is associated with the fin 10. The gate dielectric layer 22 physically separates the gate electrode 31 from the exterior surface at the sidewall of the fin 10.

The gate electrode 31 includes a section 33 of the gate stack 24 that is located in a vertical direction between the bottom spacer layer 18 and the spacer layer 26. The section 33 of the gate electrode 31 has a side edge 29 at which the gate stack 24 is terminated by the patterning. The section 33 of the gate electrode 31, which extends at least in part about the circumference of the fin 10, provides a surface area that may subsequently be used to contact the gate electrode 31. The gate electrode 31 has an L-shape due to the presence of the section 33.

The patterning removes the gate stack 24 and the layers 22, 26, and 28 from a contact landing area 35 on the top surface of the bottom source/drain region 14. The contact landing area 35 provides a surface area that is subsequently used to contact the bottom source/drain region 14.

Figure 3:
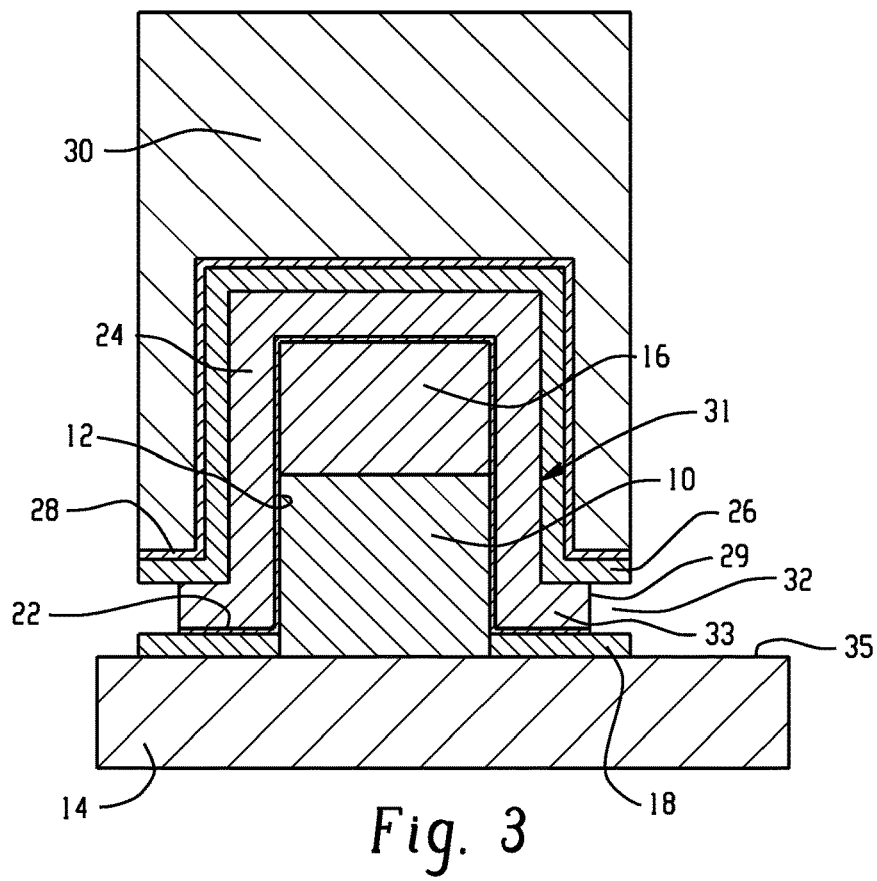

With reference to FIG. 3 in which like reference numerals refer to like features in FIG. 2 and at a subsequent fabrication stage, cavities 32 are formed by laterally recessing the section 33 of the gate electrode 31, as well as the gate dielectric layer 22, with one or more isotropic etching processes using one or more etch chemistries. The section 33 of the gate electrode 31 and the gate dielectric layer 22 may be recessed selective to (i.e., etched at a higher etch rate than) the spacer layers 18, 26 and the dielectric layer 28. The depth of the cavities 32 may range, for example, from six (6) nanometers to eight (8) nanometers.

The side edge 29 of the gate electrode 31 is relocated by the lateral etching that shortens the section 33 of the gate electrode 31, as well as the gate dielectric layer 22. One of the cavities 32 is laterally arranged in a horizontal direction between the side edge 29 of the section 33 of the gate electrode 31 and the contact landing area 35 used to contact the bottom source/drain region 14. The cavities 32 are arranged in a vertical direction between the bottom spacer layer 18 and the spacer layer 26.

Figure 4:
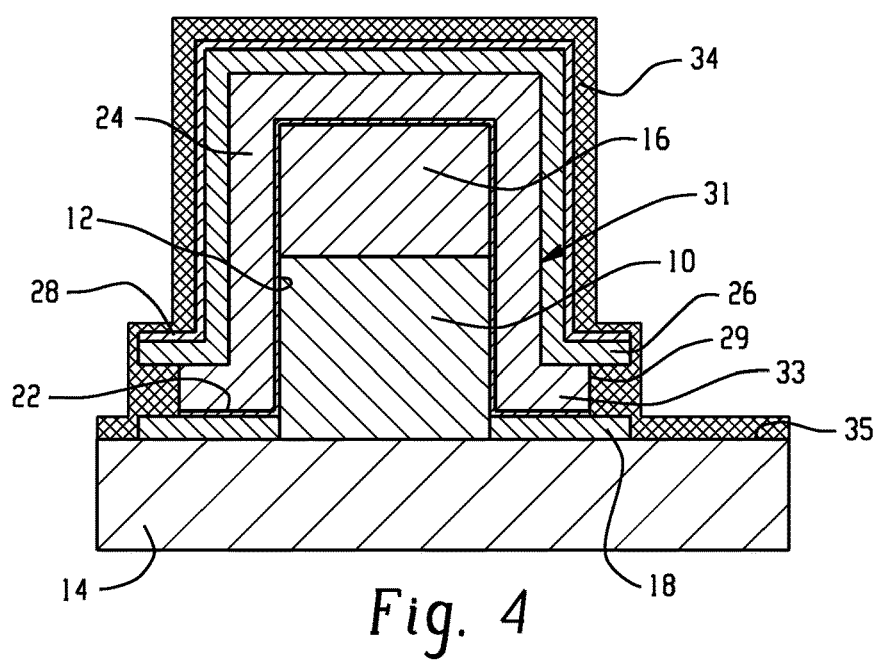

With reference to FIG. 4 in which like reference numerals refer to like features in FIG. 3 and at a subsequent fabrication stage, the sacrificial layer 30 is stripped, and a conformal dielectric layer 34 is applied that fills the cavities 32 (FIG. 3), for example, by pinch-off. The conformal dielectric layer 34 also coats the surfaces exterior of the cavities 32. The conformal dielectric layer 34 may be composed of a dielectric material, such as silicon nitride ($Si_3N_4$), deposited by ALD.

Figure 5:
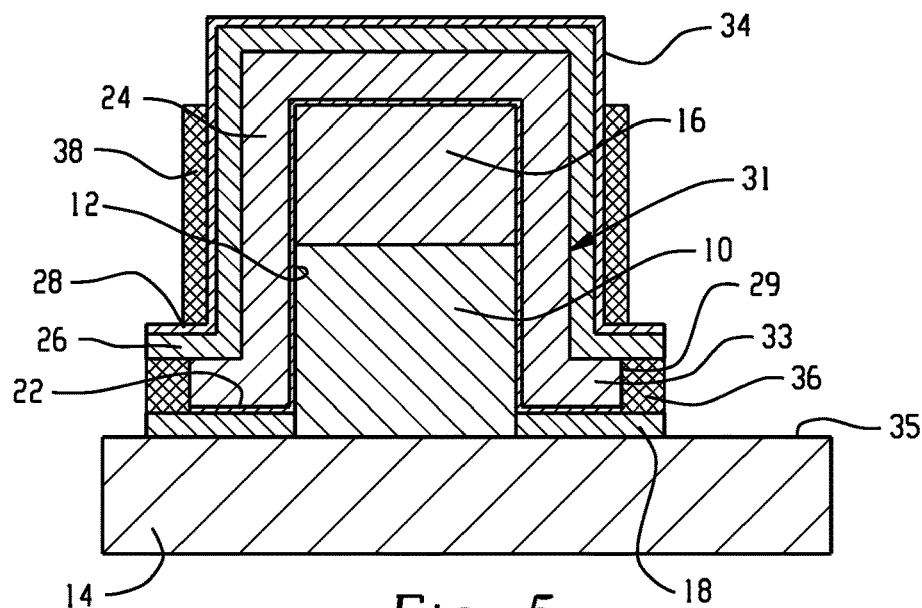

With reference to FIG. 5 in which like reference numerals refer to like features in FIG. 4 and at a subsequent fabrication stage, dielectric spacers 36 are formed from the conformal dielectric layer 34 located in the cavities 32. Dielectric spacers 38 are also formed from the conformal dielectric layer 34 with positions adjacent to the sidewalls of the gate electrode 31. The dielectric spacers 36, 38 may be formed using an anisotropic etching process, such as a RIE process.

The dielectric spacers 36 adopt the geometrical shape and the dimensions of the cavities 32. Adjacent to the contact landing area 35 used to contact the bottom source/drain region 14, one of the dielectric spacers 36 is arranged in a horizontal direction between the side edge 29 of the section 33 of the gate electrode 31 and the contact landing area 35. The dielectric spacers 36 are arranged in a vertical direction between the bottom spacer layer 18 and the spacer layer 26.

Figure 6:
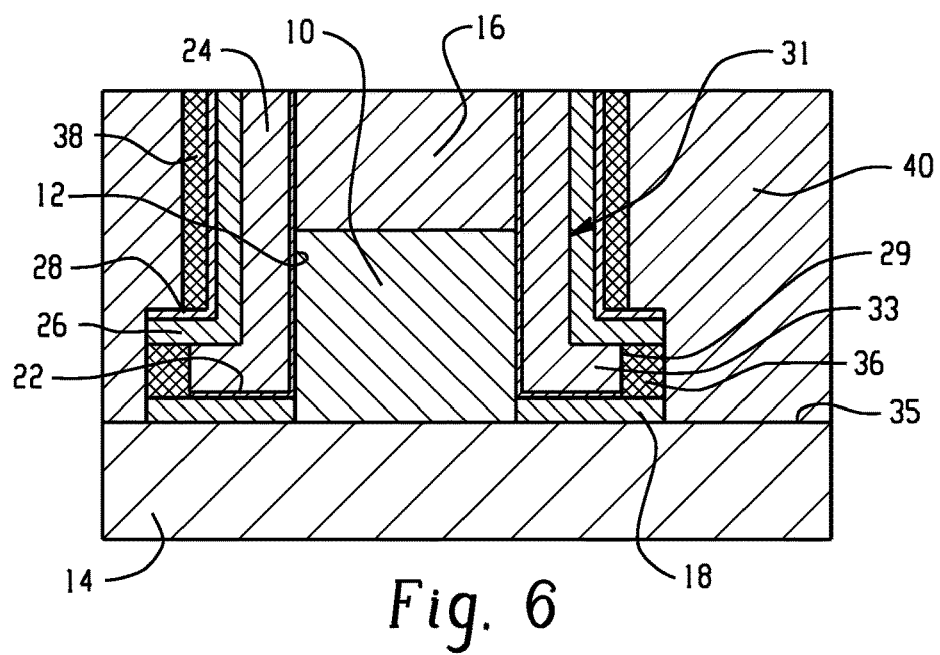

With reference to FIG. 6 in which like reference numerals refer to like features in FIG. 5 and at a subsequent fabrication stage, a gap-fill layer 40 is deposited and then planarized. The gap-fill layer 40 may be composed of a dielectric material, such as silicon dioxide ($SiO_2$), deposited by CVD and may be planarized using a chemical-mechanical polishing (CMP) process. The planarization removes the gate stack 24 and the layers 22, 26, and 28 from the top surface of the cap 16, and may stop on the dielectric spacers 38. The gate dielectric layer 22 and the gate electrode 31 are revealed adjacent to the top surface of the cap 16 by the planarization.

Figure 7:
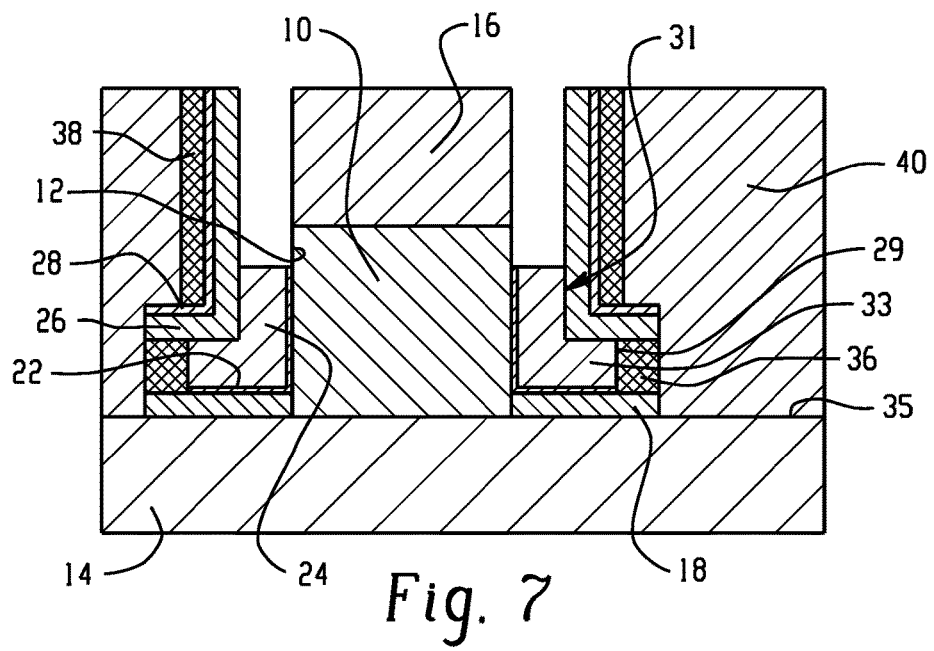

With reference to FIG. 7 in which like reference numerals refer to like features in FIG. 6 and at a subsequent fabrication stage, the gate dielectric layer 22 and gate electrode 31 are recessed in a vertical direction relative to the cap 16, spacer layer 26, and gap-fill layer 40. The gate dielectric layer 22 and gate electrode 31 are recessed below the horizontal interface between the cap 16 and fin 10. One or more etching processes with one or more etch chemistries are used to etch the materials constituting the gate dielectric layer 22 and gate electrode 31 selective to the materials constituting the cap 16, spacer layer 26, and gap-fill layer 40. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 8:
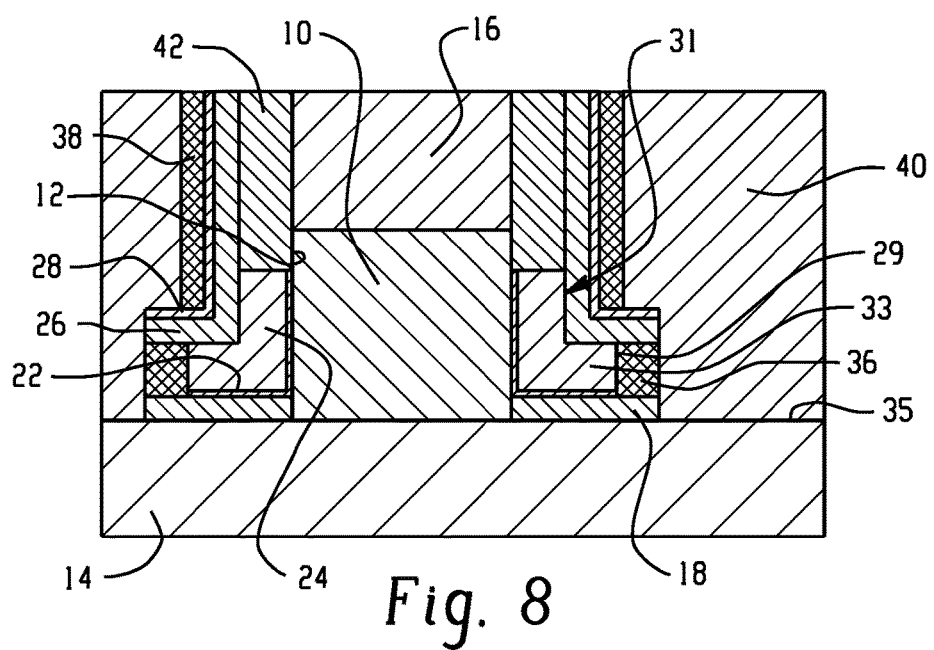

With reference to FIG. 8 in which like reference numerals refer to like features in FIG. 7 and at a subsequent fabrication stage, the space between the cap 16 and the spacer layer 26 is filled with a spacer layer 42 that is planarized using a chemical-mechanical polishing (CMP) process. The spacer layer 42 may be composed of a low-k dielectric material, such as silicon oxycarbonitride (SiOCN), deposited by ALD, and may be composed of the same low-k dielectric material as the spacer layer 26.

Figure 9:
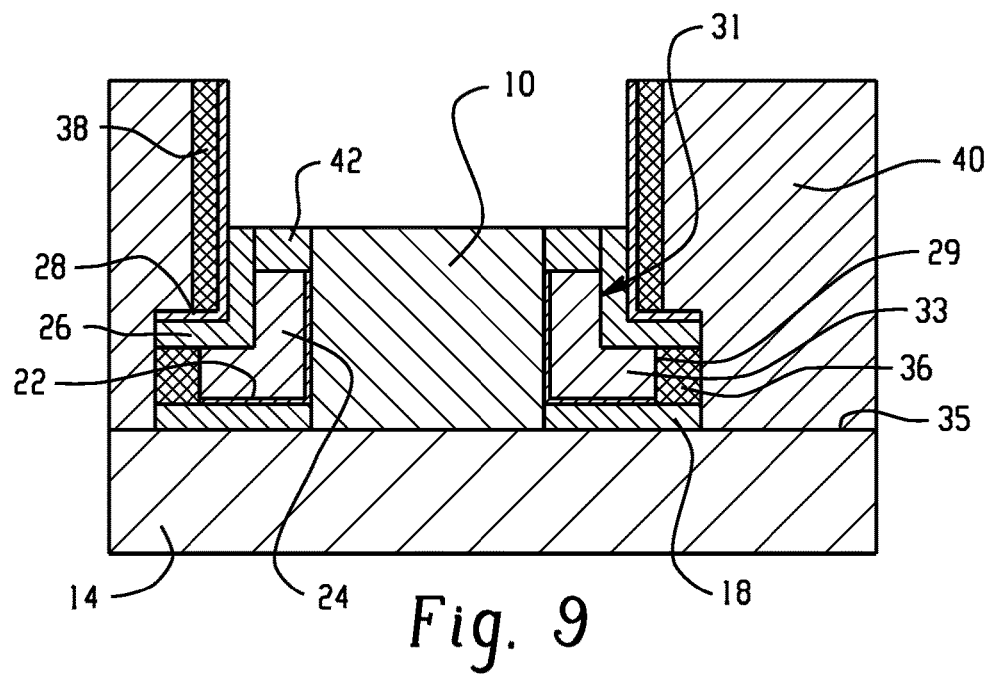

With reference to FIG. 9 in which like reference numerals refer to like features in FIG. 8 and at a subsequent fabrication stage, the cap 16 is removed selective to the spacer layer 42 to expose the top surface of the fin 10. The spacer layers 26, 42 are recessed to the top surface of the fin 10 with one or more etching processes. The removal of the cap 16 and the recessing of the spacer layers 26, 42 forms a cavity in which a source/drain region is subsequently formed. The recessed spacer layers 26, 42 collectively provide a top spacer layer that covers the gate electrode 31.

Figure 10:
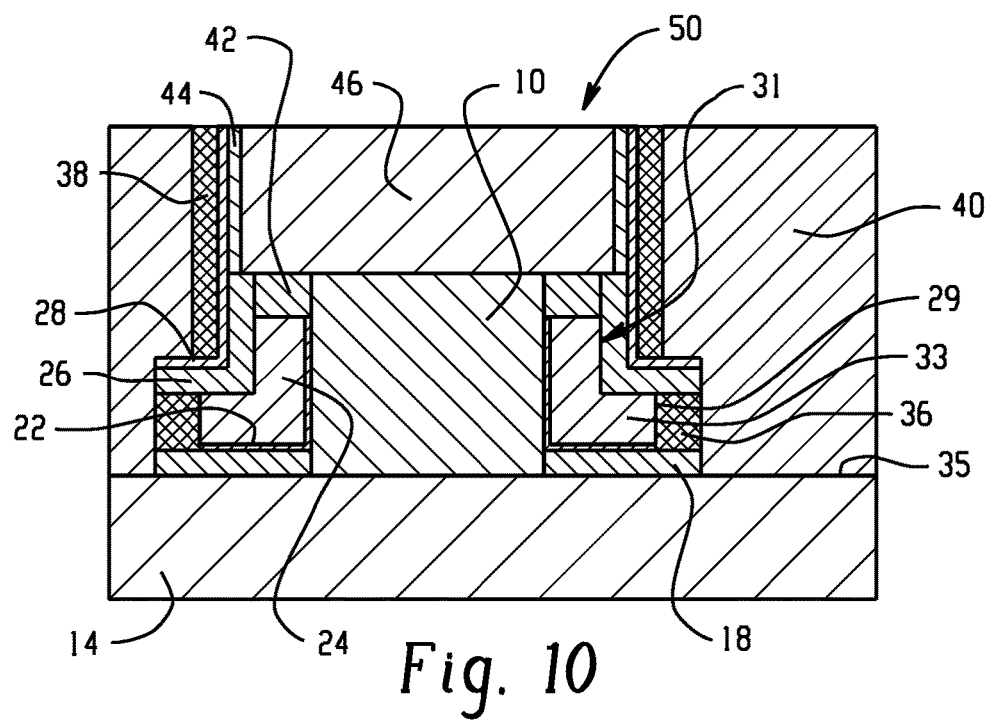

With reference to FIG. 10 in which like reference numerals refer to like features in FIG. 9 and at a subsequent fabrication stage, sidewall spacers 44 are formed inside the cavity on the dielectric spacers 38. The sidewall spacers 44 may be composed of a dielectric material, such as a low-k dielectric material like silicon oxycarbonitride (SiOCN), deposited as a conformal layer by ALD and etched with an anisotropic etching process such as a RIE process.

A top source/drain region 46 is formed in the open space of the cavity between the sidewall spacers 44. The top source/drain region 46 is coupled with the top surface of the fin 10. The spacer layer 42 is arranged vertically between the top source/drain region 46 and the gate electrode 31.

The top source/drain region 46 may be an epitaxial layer of semiconductor material formed by an epitaxial growth process with in-situ doping, and may be composed of semiconductor material that is doped to have the same conductivity type as the bottom source/drain region 14. In an embodiment, the top source/drain region 46 and the bottom source/drain region 14 may be composed of the same semiconductor material. If the bottom source/drain region 14 is n-type, then the top source/drain region 46 may be doped with a concentration of an n-type dopant from Group V of the Periodic Table (e.g., phosphorus (P) and/or arsenic (As)) that imparts n-type electrical conductivity to the constituent semiconductor material. Alternatively, if the bottom source/drain region 14 is p-type, then the top source/drain region 46 may be doped with a concentration of a p-type dopant from Group III of the Periodic Table (e.g., boron (B), aluminum (Al), gallium (Ga), and/or indium (In)) that imparts p-type electrical conductivity to the constituent semiconductor material. In an embodiment, the top source/drain region 46 may be formed by a selective epitaxial growth (SEG) process in which the semiconductor material nucleates for epitaxial growth on semiconductor surfaces (e.g., fin 10), but does not nucleate for epitaxial growth from insulator surfaces (e.g., gap-fill layer 40).

The resulting device structure is a vertical-transport field-effect transistor 50 that includes the bottom source/drain region 14, the top source/drain region 46, the fin 10 arranged in the vertical direction between the source/drain regions 14, 46, and the gate electrode 31. The gate electrode 31 is arranged along the height of the fin 10 in the vertical direction between the bottom source/drain region 14 and the top source/drain region 46. During operation, a vertical channel region for vertical carrier transport is defined in a portion of the fin 10 overlapped by the gate electrode 31 and carriers are transported in the vertical direction between the bottom source/drain region 14 and the top source/drain region 46.

Figure 11:
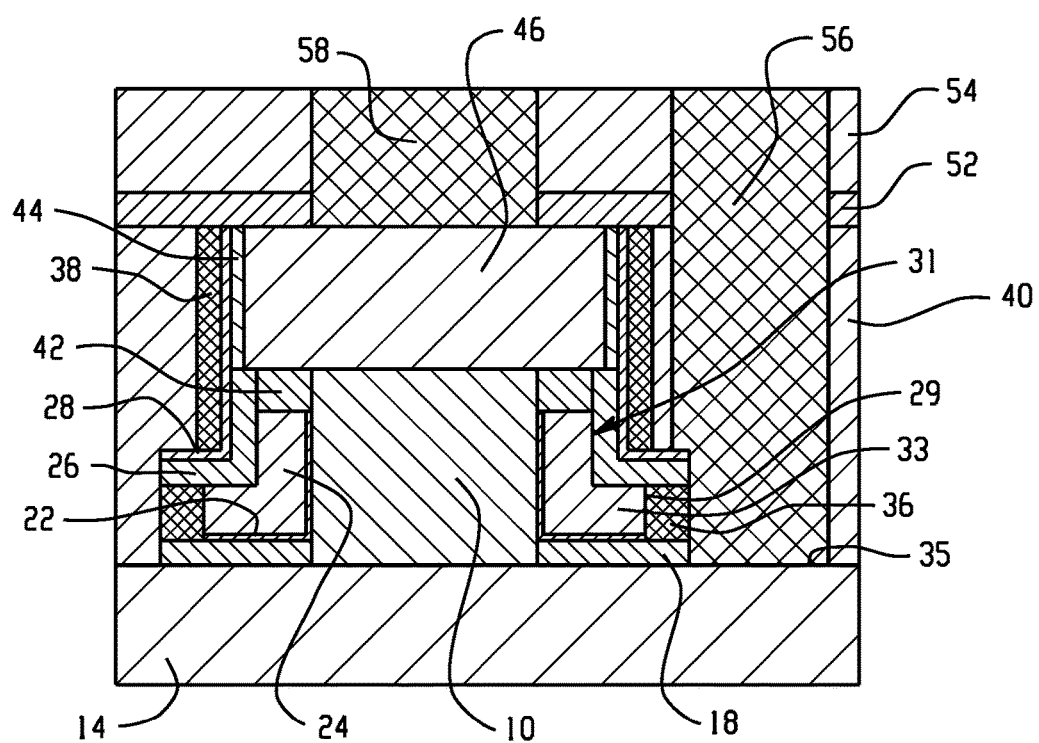

With reference to FIG. 11 in which like reference numerals refer to like features in FIG. 10 and at a subsequent fabrication stage, a dielectric layer stack that includes, for example, a dielectric layer 52 and a dielectric layer 54 is formed above the vertical-transport field-effect transistor 50. The dielectric layer 52 may be composed of an electrically-insulating dielectric material, such as such as silicon carbonitride (SiCN), deposited by CVD. The dielectric layer 54 may be composed of an electrically-insulating dielectric material, such as silicon dioxide ($SiO_2$), deposited by CVD using tetraethylorthosilicate (TEOS) and ozone ($O_2$) as reactants.

A contact 56 to the bottom source/drain region 14 is formed by patterning a contact opening in the gap-fill layer 40, dielectric layer 52, and dielectric layer 54 that extends in a vertical direction to the contact landing area 35 of the bottom source/drain region 14 and filling the contact opening with one or more conductors, such as a metal silicide and/or tungsten (W). The contact opening for the contact 56 may be formed by one or more RIE processes. The contact 56 is self-aligned by the dielectric spacers 36, the spacer layer 26 above the dielectric spacers 36, and the spacer layer 18 below the dielectric spacers 36. The contact 56 and its opening spatially overlap with the dielectric spacer 36 between the section 33 of the gate electrode 31 and the contact 56.

At least one of the dielectric spacers 36 functions as an inner spacer that provides electrical isolation between the contact 56 and the section 33 of the gate electrode 31. The dielectric spacer 36 permits the distance between the contact 56 and the adjacent section 33 of the gate electrode 31 to be scaled downwardly, increases the lithography overlap process margin due to the self-alignment, and is tolerant to the reactive ion etching processes used to form the contact openings. With respect to scaling, the dielectric spacer 36 electrically isolates the gate electrode 31 so that the contact 56 may be moved closer in proximity to the gate electrode 31 without increasing the risk of shorting. The contact 56 is not separated by a section of the dielectric layer 40 from the gate electrode 31, as required in conventional designs in order to electrically isolate the contact 56 from the gate electrode 31. The contact 56 may be more closely spaced to the gate electrode 31 because of the additional electrical isolation provided by the dielectric spacer 36.

A contact 58 to the top source/drain region 46 is formed by patterning a contact opening in the dielectric layer 52 and dielectric layer 54 by one or more RIE processes that extends in a vertical direction to top source/drain region 46 and filling the contact opening with one or more conductors, such as a metal silicide and/or tungsten (W). Similarly, a contact (not shown) to the section 33 of the gate electrode 31 is formed by patterning a contact opening in the gap-fill layer 40, dielectric layer 52, and dielectric layer 54 that extends in a vertical direction to the section 33 and filling the contact opening with one or more conductors, such as a metal silicide and/or tungsten (W). The section 33 of the gate electrode 31 extends laterally outside of the side edge of the top source/drain region 46 so that the gate electrode 31 can be contacted vertically from above. As a result, the section 33 is not masked in the vertical direction by the top source/drain region 46.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a vertical-transport field effect transistor, the structure comprising:
   a first source/drain region including a contact landing area;
   a dielectric layer over the contact landing area;
   a first spacer layer on the first source/drain region;
   a second spacer layer;
   a semiconductor fin projecting from the first source/drain region;
   a gate electrode coupled with the semiconductor fin, the gate electrode including a first section arranged laterally between the semiconductor fin and the contact landing area, and the first section of the gate electrode having a side edge that is recessed relative to the first spacer layer and to the second spacer layer, to define a cavity with the first spacer layer and the second spacer layer;
   a contact arranged in a contacting relationship with the contact landing area; and
   a dielectric spacer laterally arranged in the cavity between the side edge of the first section of the gate electrode and the contact,
   wherein the dielectric spacer and the first section of the gate electrode are arranged in a vertical direction between the first spacer layer and the second spacer layer, the contact extends in the vertical direction through the dielectric layer, the dielectric layer is comprised of a first dielectric material, and the dielectric spacer is comprised of a second dielectric material that has a different etch selectivity than the first dielectric material.

2. The structure of claim 1 wherein the contact has a directly contacting relationship with the dielectric spacer.

3. The structure of claim 1 wherein the first dielectric material is silicon dioxide, and the second dielectric material is silicon nitride.

4. A structure for a vertical-transport field effect transistor, the structure comprising:
   a first source/drain region including a contact landing area;
   a second source/drain region;
   a first spacer layer on the first source/drain region;
   a second spacer layer;
   a semiconductor fin projecting from the first source/drain region;
   a gate electrode coupled with the semiconductor fin, the gate electrode including a first section arranged laterally between the semiconductor fin and the contact landing area, and the first section of the gate electrode having a side edge that is recessed relative to the first spacer layer and to the second spacer layer to define a cavity;
   a contact arranged in a contacting relationship with the contact landing area; and
   a dielectric spacer laterally arranged in the cavity between the side edge of the first section of the gate electrode and the contact,
   wherein the dielectric spacer and the first section of the gate electrode are arranged in a vertical direction between the first spacer layer and the second spacer layer, the gate electrode includes a second section that is arranged between the semiconductor fin and the first section, a portion of the second spacer layer is arranged in the vertical direction between the first section of the gate electrode and the second source/drain region, and the second source/drain region extends laterally to overlap with the portion of the second spacer layer.

5. The structure of claim 4 wherein the contact has a directly contacting relationship with the dielectric spacer.

6. The structure of claim 4 further comprising:
   a dielectric layer over the contact landing area,
   wherein the contact extends in the vertical direction through the dielectric layer, the dielectric layer is comprised of a first dielectric material, and the dielectric spacer is comprised of a second dielectric material that has a different etch selectivity than the first dielectric material.

7. The structure of claim 6 wherein the first dielectric material is silicon dioxide, and the second dielectric material is silicon nitride.

* * * * *